US007978111B2

(12) United States Patent
Sun et al.

(10) Patent No.: US 7,978,111 B2
(45) Date of Patent: Jul. 12, 2011

(54) HIGH RESOLUTION TIME-TO-DIGITAL CONVERTER

(75) Inventors: Bo Sun, Carlsbad, CA (US); Zixiang Yang, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 394 days.

(21) Appl. No.: 12/041,426

(22) Filed: Mar. 3, 2008

(65) Prior Publication Data

US 2009/0219073 A1 Sep. 3, 2009

(51) Int. Cl.
*H03K 5/00* (2006.01)
*H03M 1/12* (2006.01)

(52) U.S. Cl. ............................ 341/155; 327/1; 331/1 R

(58) Field of Classification Search .............. 327/1, 261; 331/1 R, 18, 25; 341/155, 156
See application file for complete search history.

(56) References Cited

U.S. PATENT DOCUMENTS 6,801,150 B2 10/2004 Honda
2006/0103566 A1* 5/2006 Vemulapalli et al. ......... 341/155

OTHER PUBLICATIONS

Christiansen: "An integrated high resolution CMOS timing generator based on an array of delay locked loops," IEEE Journal of Solid-State Circuits, IEEE Service Center, Piscataway, NJ, US, vol. 31, No. 7, Jul. 1996, pp. 952-957, ISSN: 0018-9200.
International Search Report and Written Opinion—PCT/US2009/035913—International Search Authority, EPO—May 29, 2009.
Mota, et al: "A four-channel self-calibrating high-resolution time to digital converter," Electronica, Circuits, and Systems, 1998, IEEE Intl Conference on, Lisboa, Portugal, Sep. 7-10, 1998, IEEE Piscataway, NJ, US, pp. 409-412, ISBN: 978-07803-5008-3.

* cited by examiner

*Primary Examiner* — David Mis
(74) *Attorney, Agent, or Firm* — Eric Ho

(57) ABSTRACT

A time-to-digital converter (TDC) can have a resolution that is finer than the propagation delay of an inverter. In one example, a fractional-delay element circuit receives a TDC input signal and generates therefrom a second signal that is a time-shifted facsimile of a first signal. The first signal is supplied to a first delay line timestamp circuit (DLTC) and the second signal is supplied to a second DLTC. The first DLTC generates a first timestamp indicative of a time between an edge of a reference input signal to the TDC and an edge of the first signal. The second DLTC generates a second timestamp indicative of a time between the edge of the reference input signal and an edge of the second signal. The first and second timestamps are combined and together constitute a high-resolution overall TDC timestamp that has a finer resolution than either the first or second timestamps.

15 Claims, 12 Drawing Sheets

NORMALIZATION

DELAY OF THE DELAY ELEMENT AFFECTS THE PD AND HPER VALUES

PROGRAMMABLE DELAY ELEMENT

HIGH RESOLUTION TIME-TO-DIGITAL CONVERTER

BACKGROUND INFORMATION

1. Technical Field

The disclosed embodiments relate to time-to-digital converters (TDCs).

2. Background Information

A time-to-digital converter (TDC) is a circuit that produces a digital output value (sometimes referred to as a timestamp). The timestamp represents the time elapsed between an edge of a first signal and an edge of another signal. TDCs have several uses including uses in phase-locked loops (PLLs).

FIG. 1 (Prior Art) is a high level simplified conceptual block diagram of a TDC PLL 1. TDC PLL 1 involves a loop filter 2 that outputs a stream of multi-bit digital tuning words. A Digitally Controlled Oscillator (DCO) 3 receives a digital tuning word and outputs a corresponding signal DCO_OUT whose frequency is determined by the digital tuning word. DCO_OUT may, for example, have a frequency in the range of three to four GHz. An accumulator 4 increments each period of DCO_OUT, and the value of the accumulator is latched into latch 5 synchronously with a reference clock signal REF. A reference phase accumulator 6 increments by the value on its input leads 7. Reference phase accumulator 6 increments synchronously with reference clock signal REF. The value accumulated in accumulator 6 is supplied via lines 8 to a subtractor 9. The output of an adder 10 is supplied via lines 11 to subtractor 9. Subtractor 9, which is also referred to as a phase detector, subtracts the value on lines 11 from the value on lines 8 and supplies the resulting difference in the form of a digital word on lines 12 to loop filter 2.

The value on input leads 7 by which accumulator 6 increments is the sum of an integer frequency control portion on lines 13 and a fractional portion on lines 14. The fractional portion is changed over time by a delta-sigma modulator 15. The value on lines 11 is the sum of an integer portion output by latch 5 as well as a fractional portion on lines 16. A time-to-digital converter 17 produces a digital output timestamp representing the time difference between an edge of the signal DCO_OUT and an edge of the reference clock signal REF. The signal REF in this example has a fixed, but significantly lower frequency than DCO_OUT. The timestamps output by TDC 17 are normalized by a normalization circuit 18 to generate the fractional portion on lines 16.

FIG. 2 (Prior Art) is a simplified diagram of TDC 17. TDC 17 includes a delay line of inverters 19-23, and an associated set of flip-flops 24-28. A wave front of the DCO_OUT signal propagates down the delay line of inverters and when the rising edge of the reference clock signal REF occurs, the state of the signal in the delay line is clocked in parallel into flip-flops 24-28. The flip-flops output a multi-bit digital word referred to here as a "timestamp" onto lines 29.

FIG. 3 (Prior Art) is a simplified waveform diagram that illustrates an operation of TDC 17. One low pulse is captured within, and is propagating through, the delay line. The row of ones and zeros 30 represents the values on the various nodes of the delay line. When the DCO_OUT low pulse reaches the position in the delay line illustrated in FIG. 3, the signal REF transitions from low-to-high. The amount of time that elapsed between the time of the low-to-high edge of the end of the low pulse of DCO_OUT and the time of the low-to-high transition of REF is identified as time PD. The duration of time that the DCO_OUT signal remained low (half-cycle time) is identified as time HPER. If the inverters of the delay line have small propagation times (the inverters are "fast"), then the state of the signals on the nodes of the delay line might appear as indicated by row 30. PD is equal to approximately seven inverter propagation delays and HPER is equal to approximately eight inverter propagation delays. The value PD here is indicative of the time delay between the low-to-high edge of DCO_OUT and the low-to-high edge of REF. The unit of time measurement is inverter propagation delay. The TDC PLL uses this phase information to keep the TDC PLL in lock.

If, however, the inverters of the delay line have larger propagation times (the inverters are "slow"), then the state of the signals on the nodes of the delay line might appear as indicated by row 31. Rather than the value PD that indicates the duration of the time between the low-to-high edge of DCO_OUT and the low-to-high edge of REF being seven, the value PD is four. Similarly, rather than the value HPER being eight, the value HPER is four. It is desired that the timestamp as output from the TDC be normalized so that it is less dependent on propagation speed changes of the inverters of the delay line.

FIG. 4 (Prior Art) is a simplified circuit diagram of normalization circuit 18 of FIG. 1. Normalization circuit 18 receives the non-normalized timestamp value PD output from TDC 17, normalizes it using multiplier 38, and outputs a normalized timestamp value PDN onto lines 16. The normalization circuit 18 uses the HPER values output from TDC 17 to perform the normalization. The four-bit values HPER are supplied on lines 32 to an accumulator 33. Accumulator 33 increments by the value HPER on each rising edge of a much slower reference clock CKR. Accordingly if the value HPER is small, then it will take more increments of accumulator 33 for accumulator 33 to overflow and to output an overflow signal on line 34. If, however, the value HPER is large, then it will take comparatively fewer increments of accumulator 33 for the overflow condition to occur. The number of times accumulator 33 is incremented is recorded by counter 35. When the overflow condition occurs, the overflow signal on line 34 transitions high and causes latch 36 to store the count value from counter 35. Accordingly, if HPER is small, then the count value captured will be larger, whereas if HPER is large, then the count value captured will be smaller. The count value AVE_PER is supplied by lines 37 to multiplier 38. If HPER is small, then PD will be small as well, but multiplier 38 will multiply this small PD value by a larger AVE_PER thereby outputting the normalized PDN. Similarly, if HPER is large, then PD will be large as well, but multiplier 38 will multiply this large PD value by a smaller AVE_PER thereby outputting the normalized PDN.

A PLL such as TDC PLL 1 of FIGS. 1-4 sees use in many applications including in radio receivers and in radio transmitters. Improvement of the performance of the TDC PLL is desired.

SUMMARY

The overall timestamp output by a novel time-to-digital converter (TDC) can have a time resolution that is finer than the propagation delay of a delay element in a delay line within the TDC. In one example, a fractional-delay element circuit receives a TDC input signal and generates therefrom a second signal that is a time-shifted facsimile of a first signal. The TDC input signal may, for example, be a digitally controlled oscillator (DCO) output signal in an all-digital phase-locked loop (ADPLL). The first signal is supplied onto an input of a first delay line timestamp circuit (DLTC) and the second signal is supplied onto an input of a second DLTC. The first DLTC generates a first timestamp indicative of a time between an edge of a reference input signal REF to the TDC and an edge of the first signal. The second DLTC generates a second timestamp indicative of a time between the edge of REF and an edge of the second signal. The first and second timestamps are combined and together constitute a high-resolution overall TDC timestamp that has a finer resolution than either the first timestamp or the second timestamp. In one application, PLL phase noise is reduced by utilizing the high-resolution TDC.

In one particular example, each DLTC includes a delay line of inverters and an associated set of flip-flops. The flip-flops are clocked by the reference signal REF so that the flip-flops capture the states on the various nodes of the delay line at the time of an edge of the signal REF. The second signal is time-shifted with respect to the first signal by one half of an inverter propagation delay. A novel time difference equalization circuit, a feedback loop, and a programmable delay element are disclosed that generate the second signal such that the time-shift of the second signal with respect to the first signal is controlled and remains one half of an inverter delay.

The foregoing is a summary and thus contains, by necessity, simplifications, generalizations and omissions of detail; consequently, those skilled in the art will appreciate that the summary is illustrative only and does not purport to be limiting in any way. Other aspects, inventive features, and advantages of the devices and/or processes described herein, as defined solely by the claims, will become apparent in the non-limiting detailed description set forth herein.

DETAILED DESCRIPTION

Figure 5:
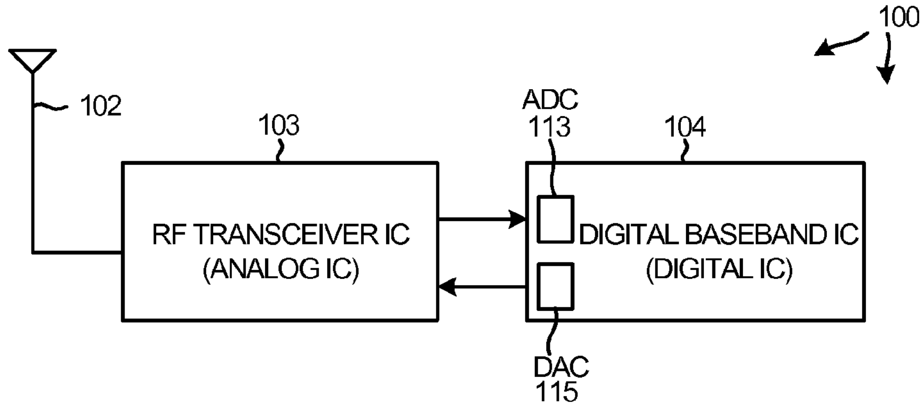
FIG. 5 is a very simplified high level block diagram of one particular type of mobile communication device 100 in accordance with one novel aspect.

FIG. 5 is a very simplified high level block diagram of one particular type of mobile communication device 100 in accordance with one novel aspect. In this particular example, mobile communication device 100 is a 3G cellular telephone that uses a Code Division Multiple Access (CDMA) cellular telephone communication protocol. The cellular telephone includes (among several other parts not illustrated) an antenna 102 and two integrated circuits 103 and 104. Integrated circuit 104 is called a "digital baseband integrated circuit" or a "baseband processor integrated circuit". Integrated circuit 103 is an RF transceiver integrated circuit. RF transceiver integrated circuit 103 is called a "transceiver" because it includes a transmitter as well as a receiver.

Figure 6:
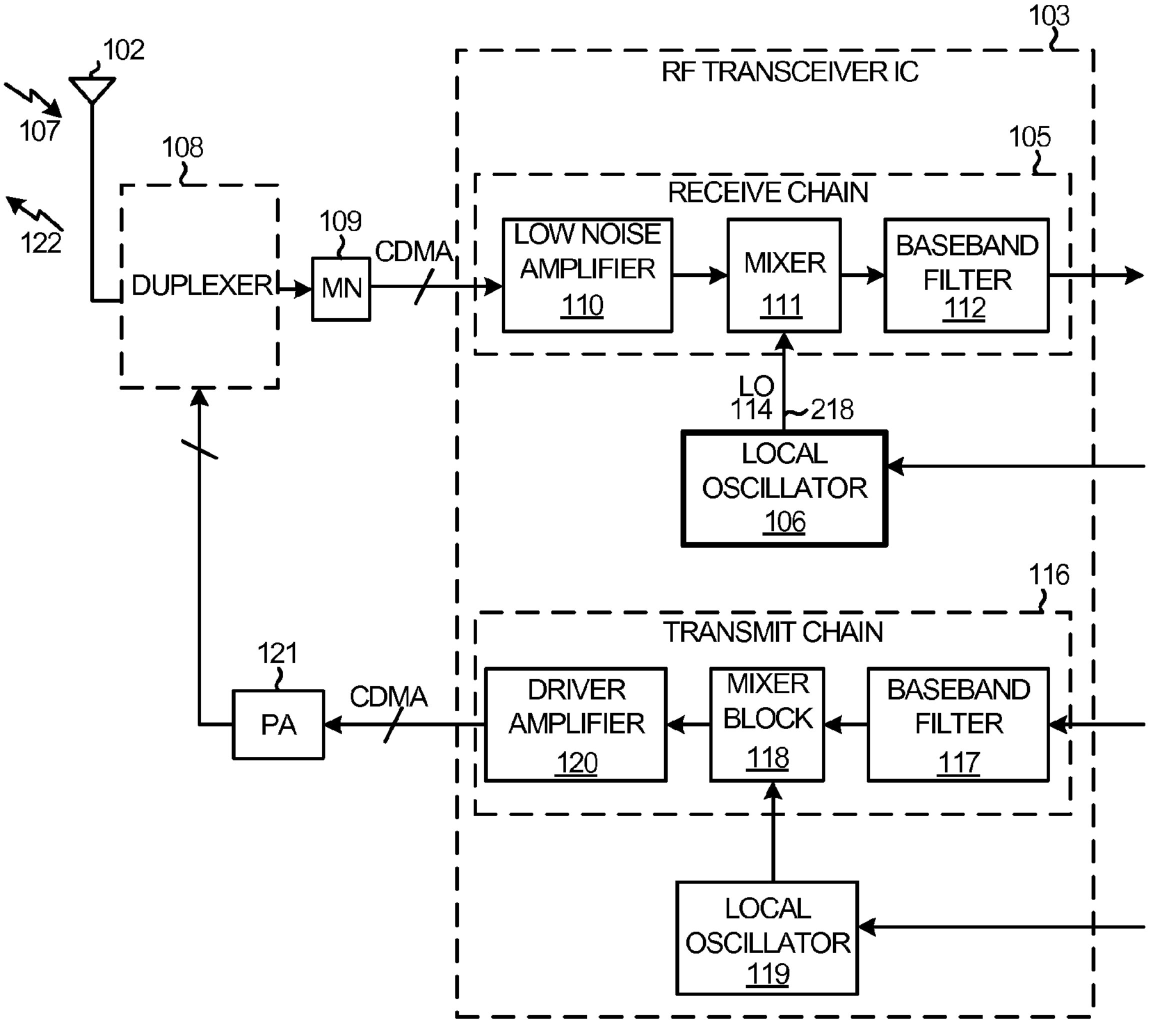
FIG. 6 is a more detailed block diagram of the RF transceiver integrated circuit 103 of FIG. 2.

FIG. 6 is a more detailed block diagram of the RF transceiver integrated circuit 103. The receiver includes what is called a "receive chain" 105 as well as a local oscillator (LO) 106. When the cellular telephone is receiving, a high frequency RF signal 107 is received on antenna 102. Information from signal 107 passes through duplexer 108, matching network 109, and through the receive chain 105. Signal 107 is amplified by low noise amplifier (LNA) 110 and is down-converted in frequency by mixer 111. The resulting down-converted signal is filtered by baseband filter 112 and is passed to the digital baseband integrated circuit 104. An analog-to-digital converter 113 in the digital baseband integrated circuit 104 converts the signal into digital form and the resulting digital information is processed by digital circuitry in the digital baseband integrated circuit 104. The digital baseband integrated circuit 104 tunes the receiver by controlling the frequency of the local oscillator signal (LO) 114 supplied by local oscillator 106 to mixer 111.

If the cellular telephone is transmitting, then information to be transmitted is converted into analog form by a digital-to-analog converter 115 in the digital baseband integrated circuit 104 and is supplied to a "transmit chain" 116. Baseband filter 117 filters out noise due to the digital-to-analog conversion process. Mixer block 118 under control of local oscillator 119 then up-converts the signal into a high frequency signal. Driver amplifier 120 and an external power amplifier 121 amplify the high frequency signal to drive antenna 102 so that a high frequency RF signal 122 is transmitted from antenna 102.

Figure 7:
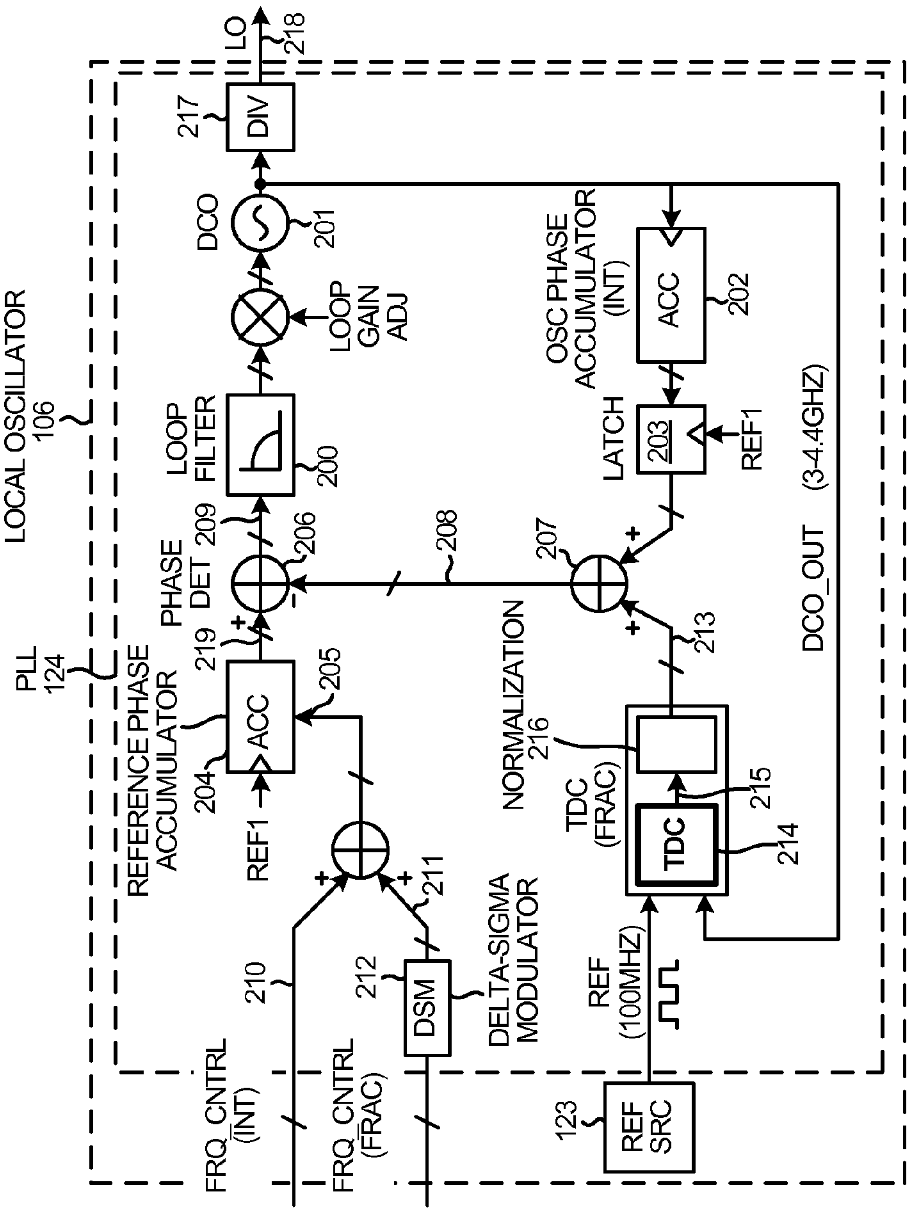
FIG. 7 is a more detailed block diagram of the local oscillator 106 of FIG. 6.

FIG. 7 is a more detailed diagram of local oscillator 106. Local oscillator 106 includes a reference clock signal source 123 and a fractional-N phase-locked loop (PLL) 124. In the present example, the reference clock signal source 123 is a connection to an external crystal oscillator module. Reference source 123 may, for example, be a signal conductor in this case. Alternatively, the reference clock signal source 123 is an oscillator disposed on RF transceiver integrated circuit 102, where the crystal is external to integrated circuit 102 but is attached to the oscillator via terminals of the integrated circuit 102.

PLL 124 is a time-to-digital (TDC) all-digital phase-locked loop (ADPLL). PLL 124 includes a loop filter 200 that outputs a stream of digital tuning words. A Digitally Controlled Oscillator (DCO) 201 receives a digital tuning word and outputs a corresponding signal DCO_OUT whose frequency is determined by the digital tuning word. DCO_OUT may, for example, have a frequency in the range of 4 GHz. An accumulator 202 increments each period of DCO_OUT, and the value of the accumulator is latched into latch 203 synchronously with a reference clock signal REF1. A reference phase accumulator 204 increments by a value on its input leads 205 synchronously with reference clock signal REF1. The value accumulated in accumulator 204 is supplied via lines 219 to a subtractor 206. The output of an adder 207 is supplied via lines 208 to subtractor 206. Subtractor 206, which is also referred to as a phase detector, subtracts the value on lines 208 from the value on lines 219 and supplies the resulting difference in the form of a digital word on lines 209 to loop filter 200.

The value on input leads 205 by which accumulator 204 increments is the sum of an integer frequency control portion on lines 210 and a fractional portion on lines 211. The fractional portion is changed over time by a delta-sigma modulator 212. The value on lines 208 is the sum of an integer portion output by latch 203 as well as a fractional portion on lines 213. A novel time-to-digital converter 214 produces a high-resolution digital output timestamp on lines 215 to normalization circuit 216. Each high-resolution timestamp represents the time difference elapsed between an edge of the signal DCO_OUT and an edge of the reference clock signal REF. The signal REF in this example has a fixed, but significantly lower frequency than DCO_OUT. REF may, for example, be a 100 MHz signal whereas DCO_OUT may be in the range of from 3.o to 4.4 GHz. Normalization circuit 216 outputs normalized timestamp values onto lines 213. The timestamps output by TDC 214 are normalized by normalization circuit 216 to generate the fractional portion on lines 213. The DCO_OUT signal that is output by DCO 201 is divided by a fixed divider 217 (for example, divide by four) to generate the local oscillator output signal LO on output lead 218.

Figure 8:
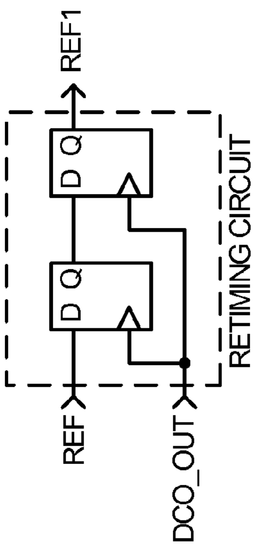
FIG. 8 is a diagram of a retiming circuit used in the local oscillator of FIG. 7.

FIG. 8 is a diagram of a retiming circuit that generates the reference clock signal REF1 from reference clock signal REF. The circuit synchronizes REF to the DCO_OUT signal.

Figure 9:
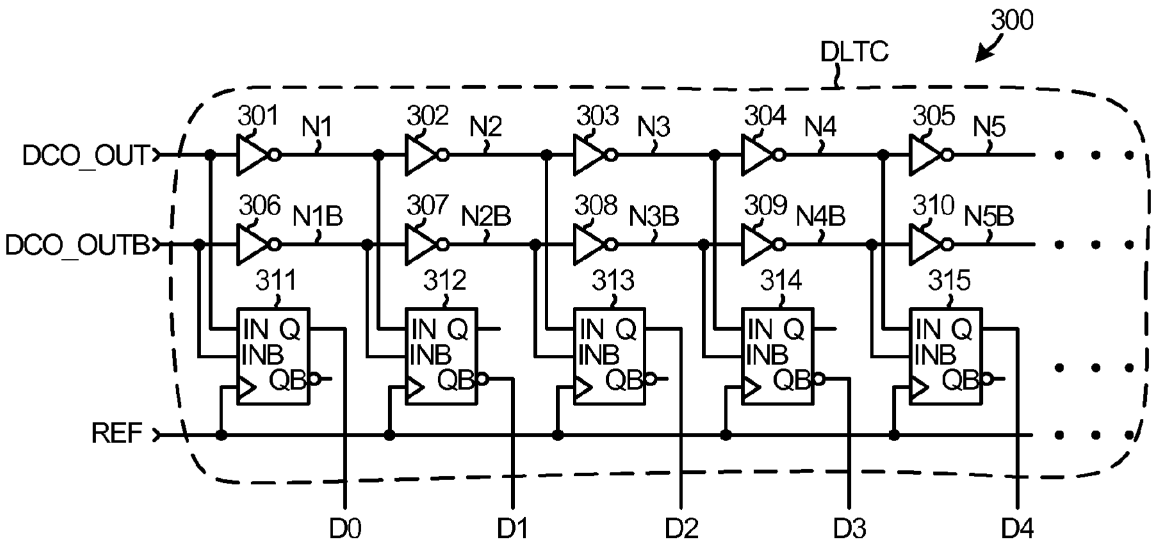
FIG. 9 is a diagram of a delay line timestamp circuit (DLTC).

FIG. 9 is a diagram of a differential delay line timestamp circuit (DLTC) 300 involving a first delay line of inverters 301-305, a second delay line of inverters 306-310, and an associated set of differential input flip-flops 311-315. The signal DCO_OUT is made to propagate down the first delay line, and its inverse DCO_OUT is made to propagate down the second delay line. The signals DCO_OUT and DCO_OUTB on corresponding nodes of the delay lines transition logic levels at substantially the same times. Flip-flops 311-315, which are clocked by reference clock signal REF, capture the states of the signals on the various nodes N1-N5 and N1B-N5B at the time that signal REF transitions from low to high. The digital values D1-D4 constitute a multi-bit timestamp PD as well as a multi-bit value HPER. The value HPER is indicative of the duration of the half-period of DCO_OUT.

Figure 10:
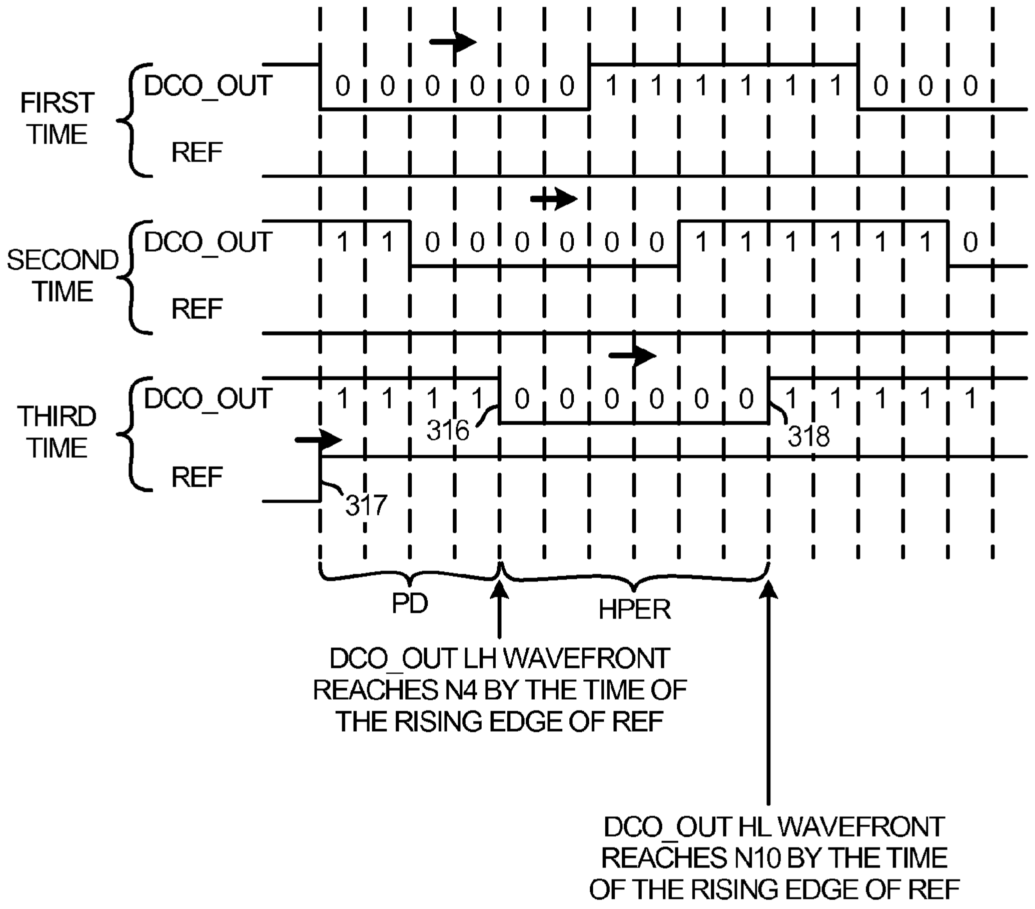
FIG. 10 is a diagram that illustrates an operation of the DLTC of FIG. 9.

FIG. 10 is a waveform diagram that illustrates the operation of DLTC 300 of FIG. 9. The upper two waveforms illustrate the values on the nodes of the first delay line at a first time. The next two waveforms illustrate the values on the nodes of the first delay line at a second time. Note that the waveform has propagated from left to right the distance of two inverters. At the second time, the reference clock signal is still at a digital logic low. The lower two waveforms illustrate the values on the nodes of the first delay line at a third time when the reference clock signal REF transitions from low to high. Note that a low half-period of the signal DCO_OUT is captured in the delay line, and that the low-to-high transition 316 at the end of the low pulse has propagated to node N4 by the time the reference clock REF transitioned high at the third time. The flip-flops 311-315 capture the values on the nodes at the third time. The first four consecutive high values are indicative of the time between the low-to-high edge 316 of DCO_OUT and the low-to-high edge 317 of REF. The value of four (PD) is in units of inverter propagation delays. The string of six consecutive low values is indicative of the duration of the half-period of DCO_OUT between edge 318 and 316. The value of six (HPER) is in units of inverter propagation delays.

Figure 1:
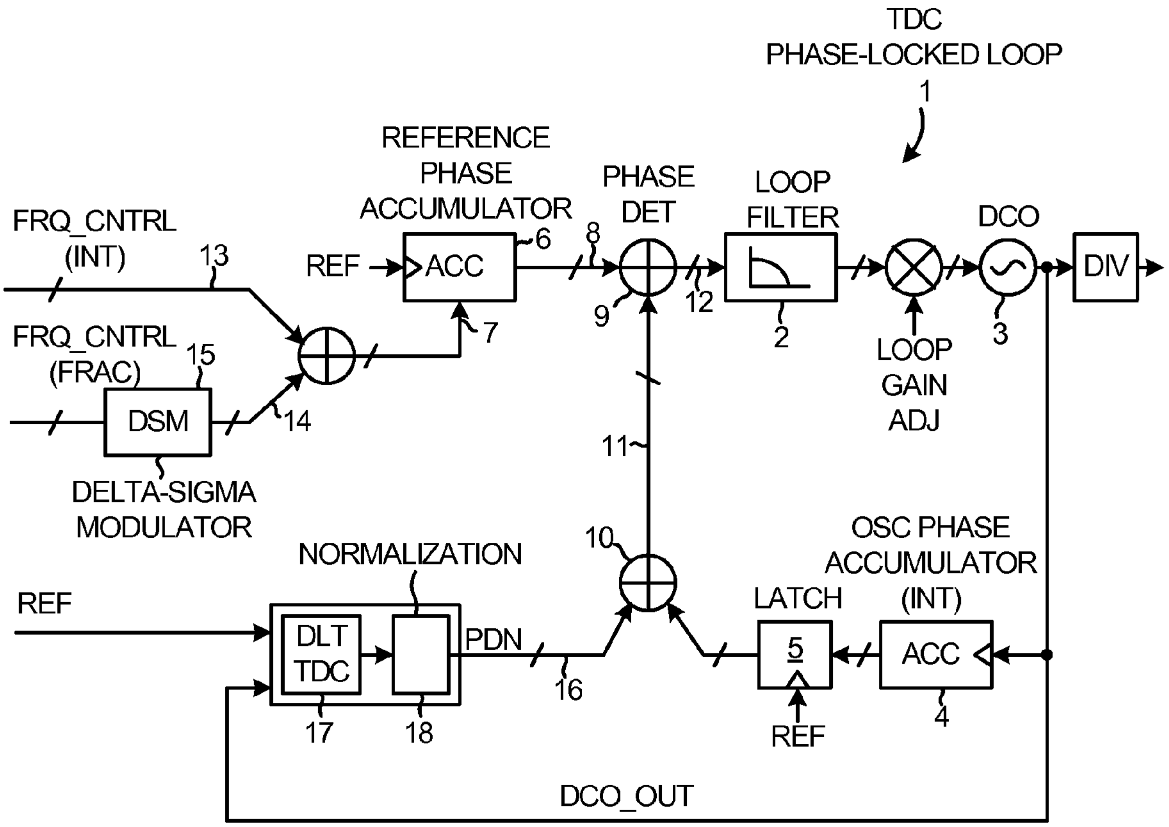
(PRIOR ART) FIG. 1
FIG. 1 (Prior Art) is a simplified block diagram of a conventional fractional-N time-to-digital converter (TDC) phase-locked loop (PLL).
Figure 2:
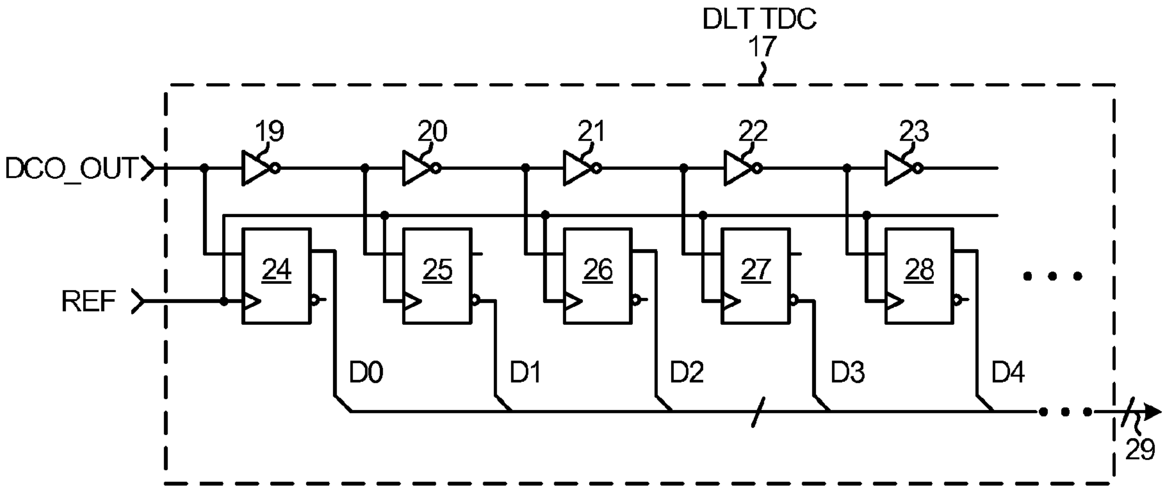
(PRIOR ART) FIG. 2
FIG. 2 (Prior Art) is a diagram of one type of conventional delay line timestamp time-to-digital converter (TDC).
Figure 3:
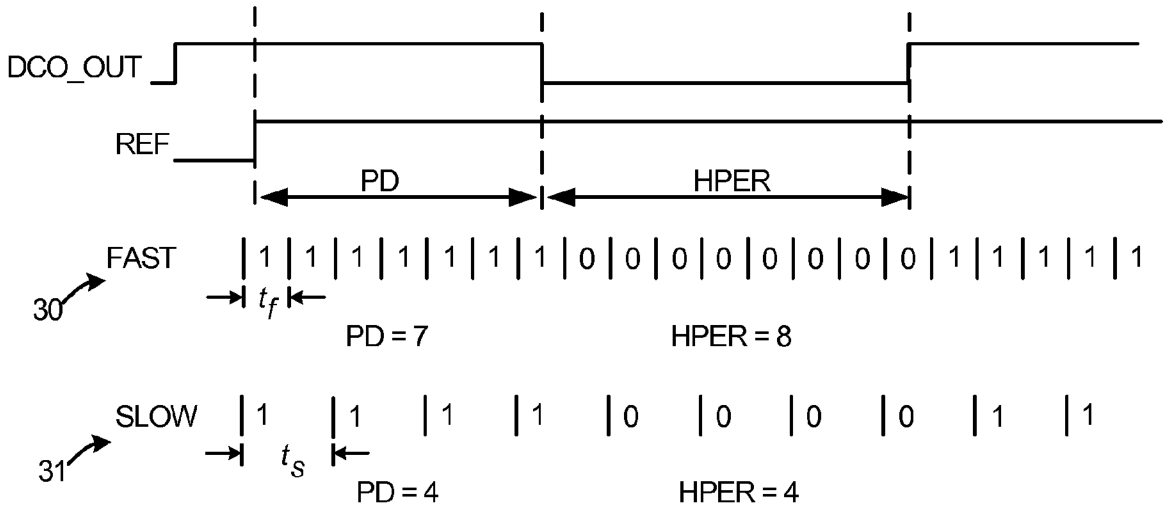
(PRIOR ART) FIG. 3
FIG. 3 (Prior Art) is a diagram that illustrates how the timestamp output of the TDC of FIG. 2 can change.
Figure 4:
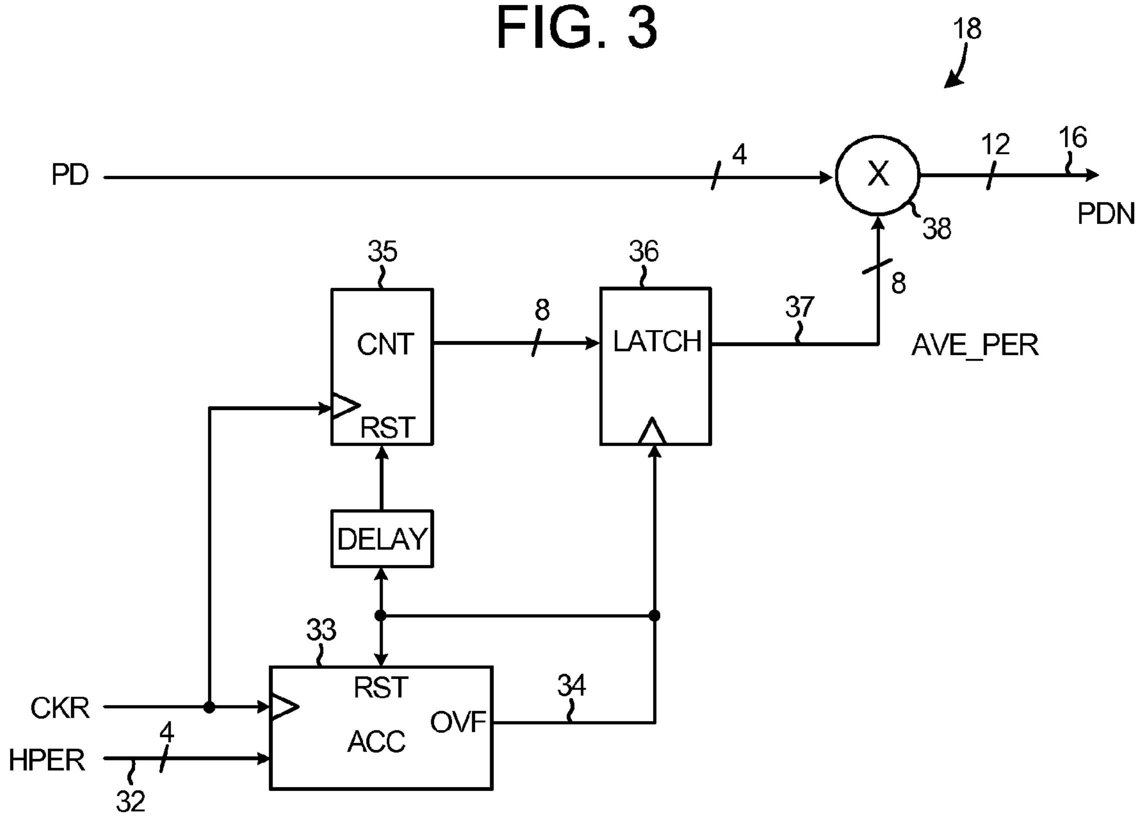
(PRIOR ART) FIG. 4
FIG. 4 (Prior Art) is a diagram of a conventional normalization circuit used to normalize TDC timestamps.
Figure 11:
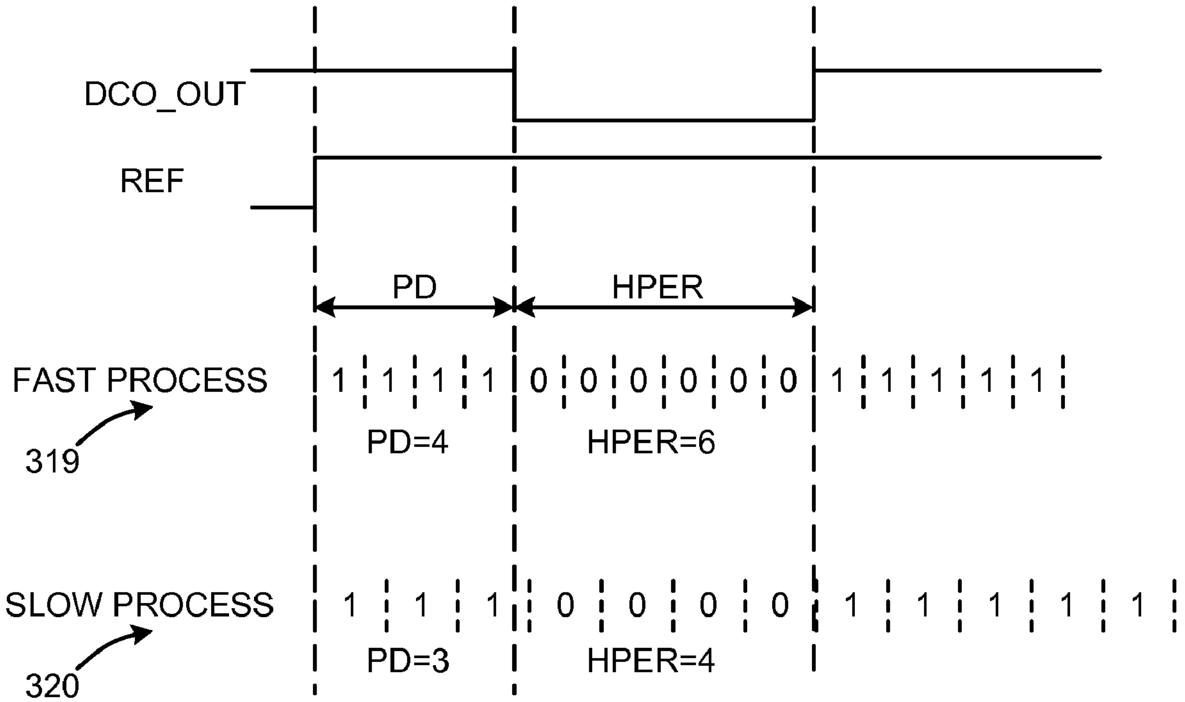
FIG. 11 is a diagram that illustrates how the timestamp value output by the DLTC of FIG. 9 can change due to changes in inverter propagation delay.

FIG. 11 is a simplified waveform diagram that illustrates how the values of PD and HPER can change as a function of inverter propagation delay for the same DCO_OUT versus REF time difference. If the inverters of the delay lines of the DLTC 300 of FIG. 9 have small propagation times (the inverters are "fast"), then the state of the signals on the nodes of the delay line might appear as indicated by row 319. PD is equal to approximately four inverter propagation delays and HPER is equal to approximately six inverter propagation delays. If, however, the inverters of the delay line have larger propagation times (the inverters are "slow"), then the state of the signals on the nodes of the delay line might appear as indicated by row 320. Rather than the value PD being four, the value of PD is three. Rather than the value of HPER being six, the value of HPER is four. The PD values can be normalized by a normalization circuit (such as normalization circuit 18 of FIG. 4). DLTC 300 or a similar circuit can be used as the TDC 214 of FIG. 7.

Figure 12:
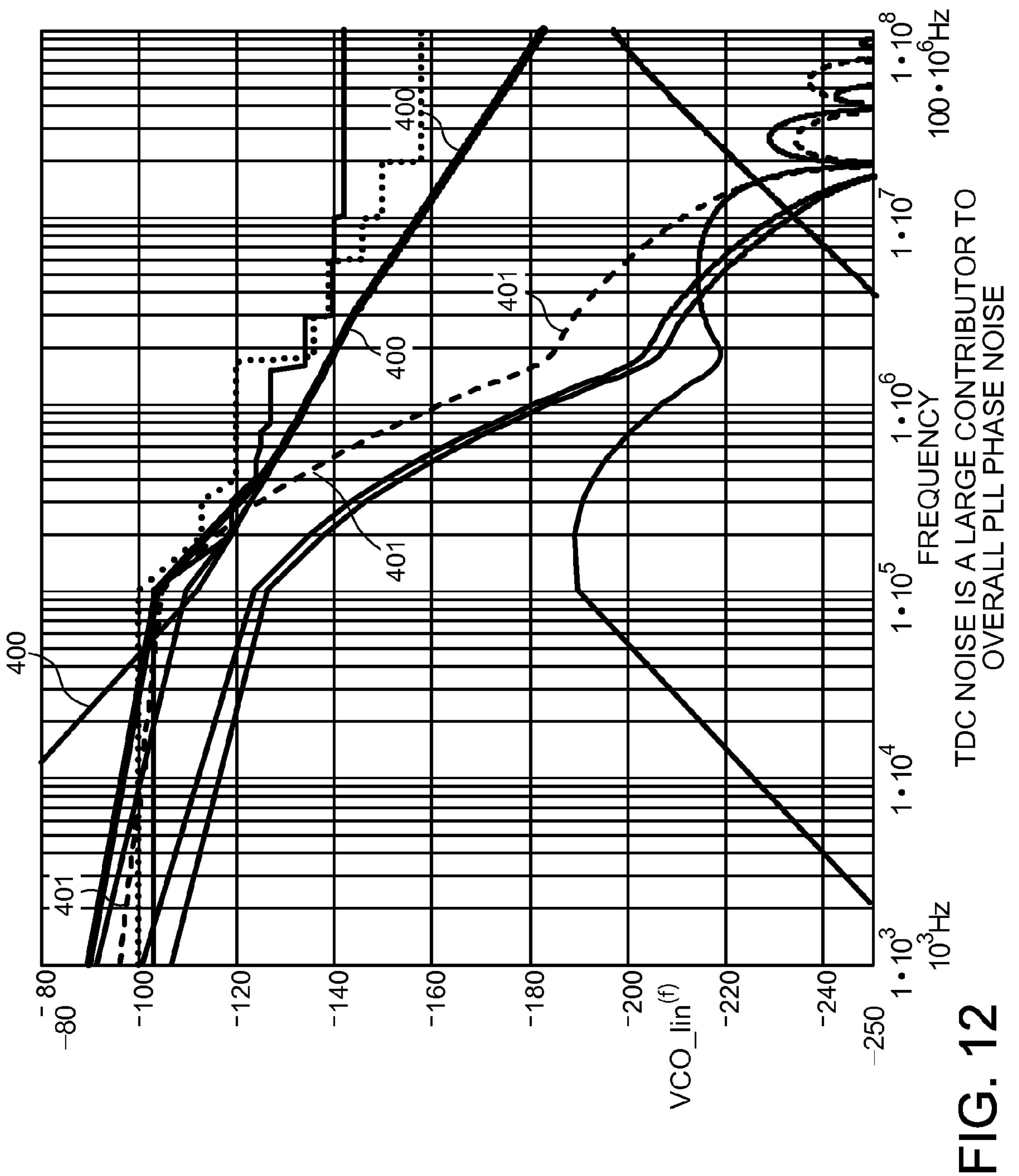
FIG. 12 is a chart that illustrates how TDC quantization noise may be a large contributor to overall PLL phase noise.

FIG. 12 is a chart that illustrates the overall phase noise 400 of a TDC versus various contributors to that noise such as, for example, TDC noise 401, phase detector noise, DCO noise, and other contributors. As indicated by the chart, the phase noise contribution of TDC quantization noise 401 is a large proportion of the overall PLL phase noise 400. TDC quantization noise is proportional to the propagation delay of the delay elements in the delay lines of DLTC 300. If this is recognized, then it may be attempted to reduce the propagation delay of the delay elements as much as possible, and to use as fast a semiconductor process as possible in order to keep delay element propagation times as low as possible. If, for example, the delay element is an inverter, then there is a practical limit to how fast the inverters of the delay lines of DLTC 300 can be made. It may, however, be desired to reduce TDC quantization noise below this level. Therefore, in accordance with one novel aspect, the novel TDC 214 is employed.

Figure 13:
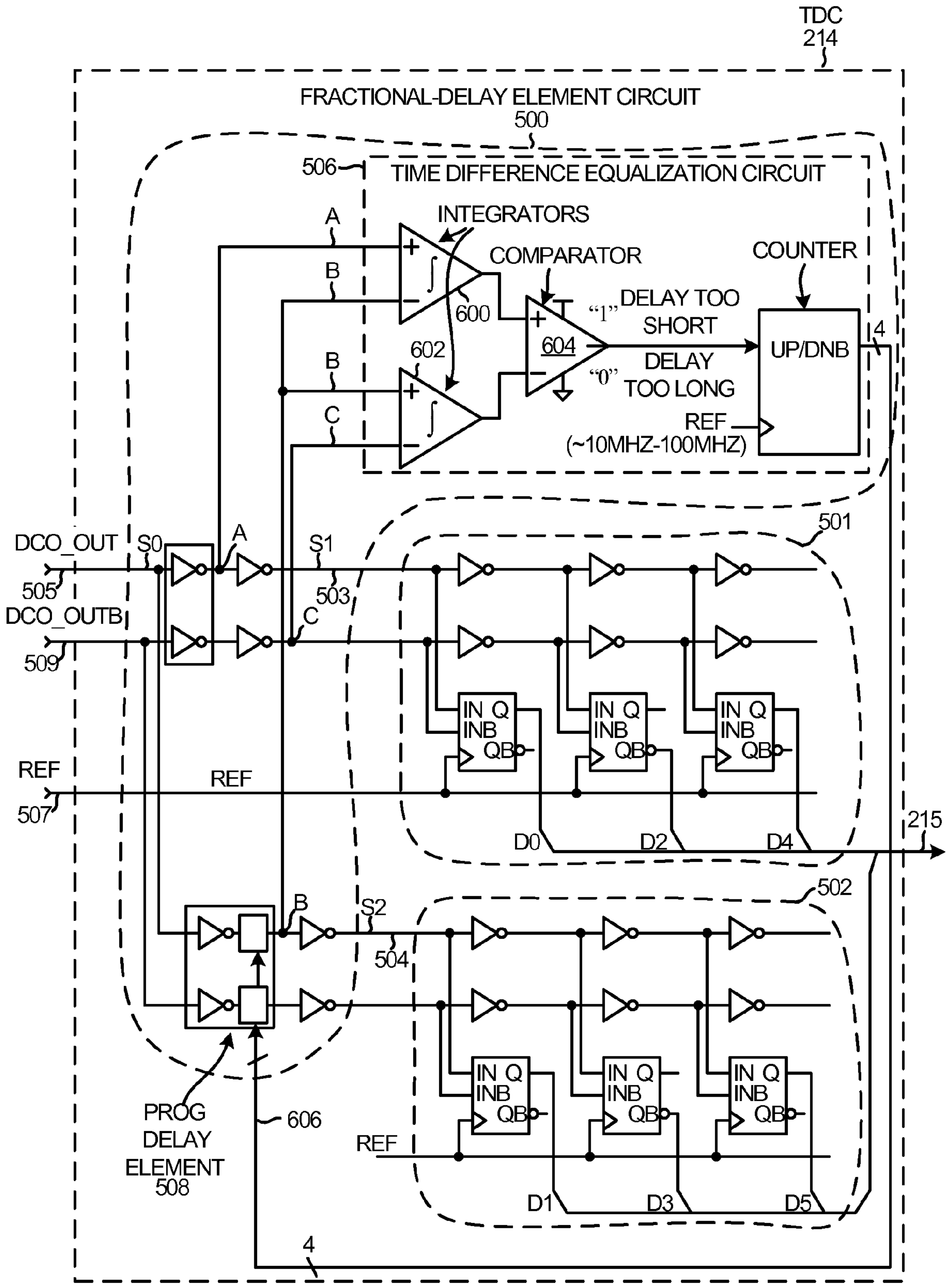
FIG. 13 is a circuit diagram of the novel high-resolution time-to-digital converter (TDC) 214 of the local oscillator 106 of FIG. 7.

FIG. 13 is a diagram of novel TDC 214. Novel TDC 214 includes a fractional-delay element circuit 500, a first delay line timestamp circuit (DLTC) 501, and a second DLTC 502. The fractional-delay element circuit 500 receives an input signal (DCO_OUT also denoted as S0 here) and outputs a first time-shifted version S1 of the input signal and a second time-shifted version S2 of the input signal. The first time-shifted version S1 is supplied onto a first input node 503 of first DLTC 501. The second time-shifted version S2 is supplied onto a second input node 504 of first DLTC 502. The second time-shifted version S2 on node 504 is time-shifted with respect to the first time-shifted version S1 on node 503 by one half of the propagation delay of the delay elements of the delay lines of the two DLTCs 501 and 502. In this example, the delay elements of the delay lines of the two DLTCs 501 and 502 are inverters, and the time-shift between signals S1 and S2 is one-half of an inverter propagation delay.

Fractional-delay element circuit 500 includes a first propagation delay circuit that receives the input signal (DCO_OUT) on input lead 505 and outputs the first time-shifted version S1 onto node 503. The fractional-delay element circuit 500 also includes a second propagation delay circuit that receives the input signal (DCO_OUT) on input lead 505 and outputs the second time-shifted version S2 onto node 504. The fractional-delay element circuit 500 also includes a time difference equalization circuit 506 that controls a programmable delay element 508 within the second propagation delay circuit to maintain the desired time-shift relationship between the signals S1 and S2. As indicated in FIG. 13, both the first and second DLTCs 501 and 502 are clocked by the same reference clock signal REF received on input lead 507. The timestamp output from the first DLTC 501 is combined with the timestamp output from the second DLTC 502 onto output lines 215 to form an overall TDC timestamp that has higher resolution than either DLTC 501 or DLTC 502.

Figure 14:
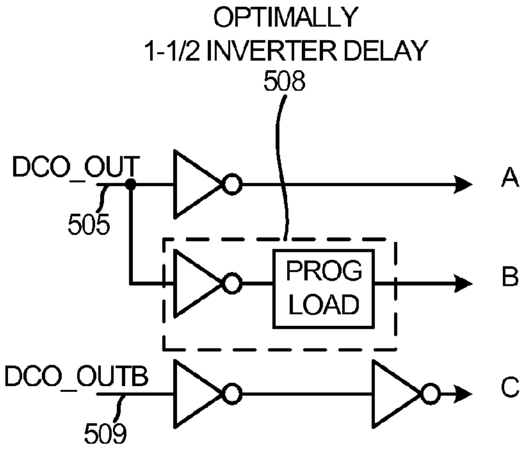
FIG. 14 is a simplified diagram that illustrates a part of the TDC of FIG. 13.

FIG. 14 is a simplified diagram that illustrates a part of the circuit of FIG. 13. The signal DCO_OUT is received onto input lead 505 and the inverse signal DCO_OUTB is received onto input lead 509. There is one inverter propagation delay between the signal DCO_OUT on input lead 505 and the signal on node A. There are two inverter propagation delays between the signal DCO_OUTB on input lead 509 and the signal on node C. DCO_OUT and DCO_OUTB transition at substantially the same times.

Figure 15:
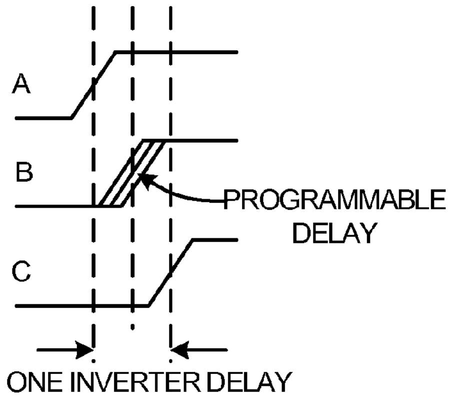
FIG. 15 is a waveform diagram that illustrates time-shifts between signals on nodes A, B and C of the circuit of FIG. 14.

FIG. 15 illustrates the two signals on nodes A and C and indicates that there is one inverter propagation delay between the low-to-high rising edge of the signal on node A and the low-to-high rising edge of the signal on node C. What is desired, in order to supply the second time-shifted signal S2 onto node 504 in FIG. 13 in proper relation to the first time-shifted signal S1, is that the signal on node B in FIG. 14 transition in time exactly half-way between the transition time of the signal on node A and the transition time of the signal on node C. The programmable delay element 508 of FIG. 14 is to be controlled such that the signal on node B transitions at this time.

Figure 16:
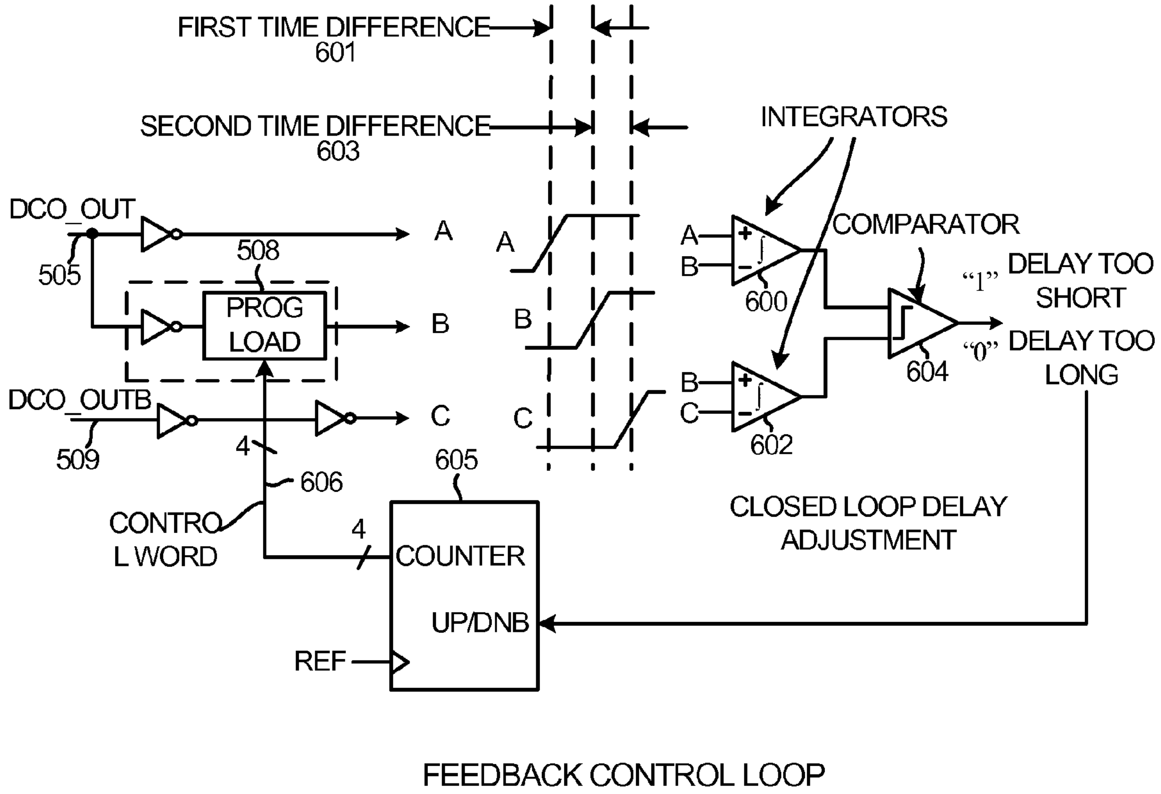
FIG. 16 is a diagram of the feedback control loop of the novel high-resolution TDC of FIG. 13.

FIG. 16 is a simplified diagram that illustrates how the time difference equalization circuit 506 of FIG. 13 controls the programmable delay element 508. A first circuit 600 generates an output signal whose magnitude is indicative of a first time difference 601 between the rising edge of the signal on node A and the corresponding rising edge of the signal on node B. A second circuit 602 generates an output signal whose magnitude is indicative of a second time difference 603 between the rising edge of the signal on node B and the corresponding rising edge of the signal on node C. The remainder of the circuit includes a feedback loop that operates to control programmable delay element 508 such that the outputs of the two circuits 600 and 602 are substantially equal over time. In particular, a comparator 604 is coupled to receive the signals output from circuits 600 and 602 such that the output of the comparator is a digital high if first time difference 601 is greater than second time difference 603. Comparator 604 outputs a digital logic low if first time difference 601 is smaller than second time difference 603. The output of comparator 604 is smoothed by counter 605. The digital output of comparator 604 is a digital value supplied onto an up/down input control lead of counter 605 and the counter is made to each increment or decrement on the rising edge of a reference clock such as REF. The "B" in the UP/DNB" notation indicates down "bar", i.e., that the counter is controlled to count down if the signal on the UP/DNB input lead is a digital logic low. The signal REF that clocks counter 605 has a fixed frequency (in the range of from approximately 10 MHz to 100 MHz) and the signal REF is only allowed to transition high and clock the counter 605 shortly after the signal on node C transitions high. The four-bit output of counter 605 is supplied as a control word to control programmable delay element 508. The operation of this closed feedback control loop causes the first time difference 601 to be substantially equal to the second time difference 603.

Figure 17:
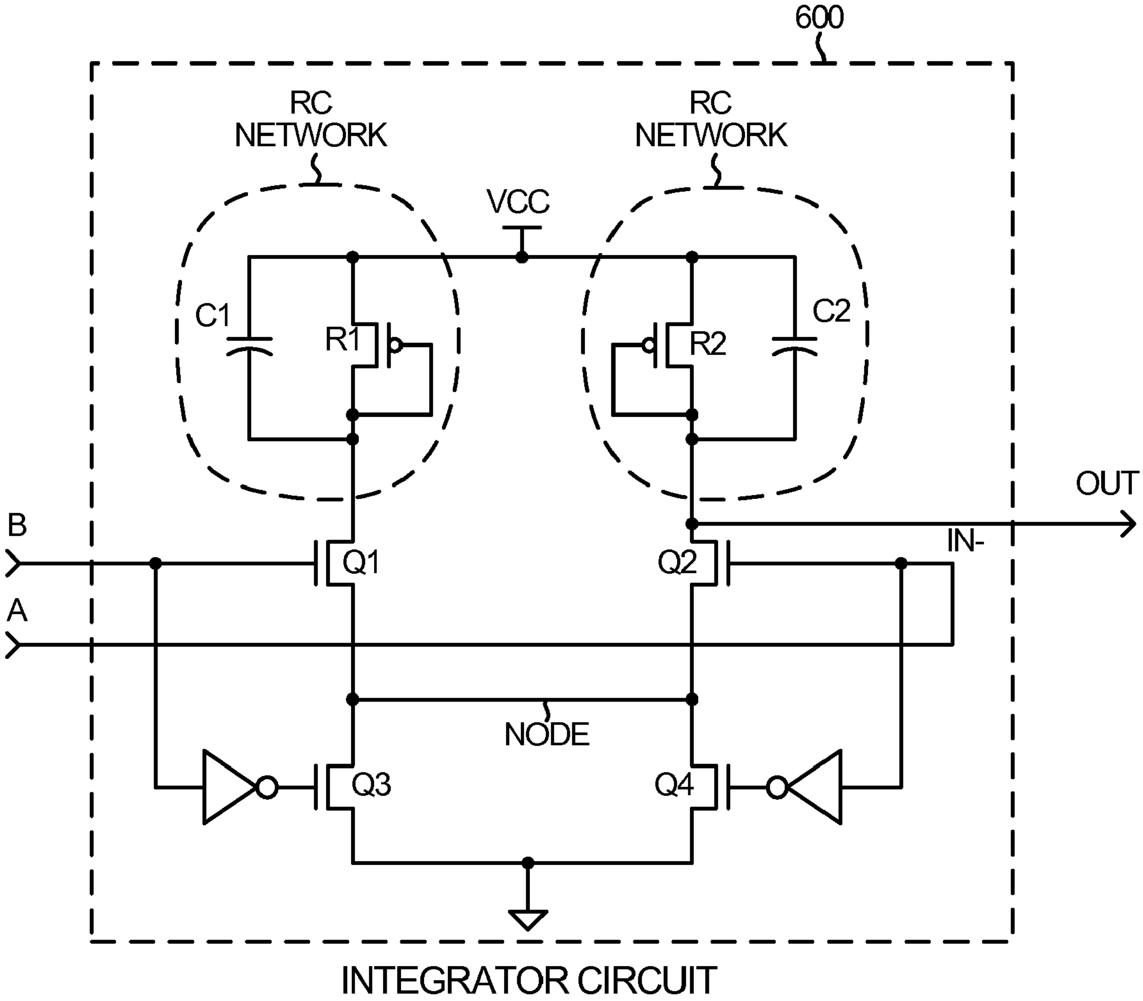
FIG. 17 is a diagram of one way to realize circuits 600 and 602 of FIG. 13.
Figure 18:
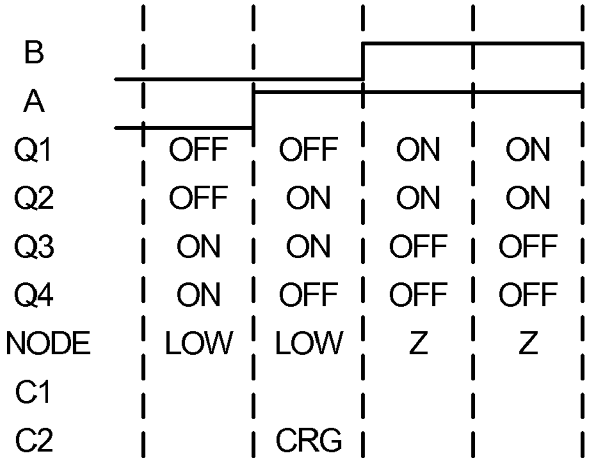
FIG. 18 is a diagram that illustrates an operation of circuit 600 of FIG. 17.

FIG. 17 is a circuit diagram of one way that circuit 600 (and circuit 602) can be realized. FIG. 18 illustrates an operation of the circuit 600. When both input signals on nodes A and B are low, then transistors Q1 and Q2 are off. Whatever charge was developed on capacitors C1 and C2 is therefore bleeding off through resistances R1 and R2. Next, when the signal on node A goes high, then transistor Q2 is turned on and transistor Q4 is turned off. Because node NODE is grounded by conductive transistor Q3, capacitor C2 is charged by a current path from capacitor C2, through Q2, and through Q3 to ground. This causes the voltage on node OUT to decrease. The time duration of this state of the signals on nodes A and B determines how much charging occurs, and how low the voltage on node OUT goes. Next, when the signal on node B goes high, then transistor Q1 is turned on and transistor Q3 is turned off. Because both transistors Q3 and Q4 are off, node NODE is no longer coupled to ground. This condition is designated with the symbol "Z" in FIG. 18. The charges on capacitors C1 and C2 will substantially equilibrate and discharge through their respective resistances R1 and R2. Accordingly, the magnitude of the voltage (average voltage) on the output node OUT is indicative of the duration of the time difference between the rising edge of the signal on node A and the rising edge of the signal on node B. The longer the duration of the charge state versus the discharge states, the lower the voltage on node OUT.

Figure 19:
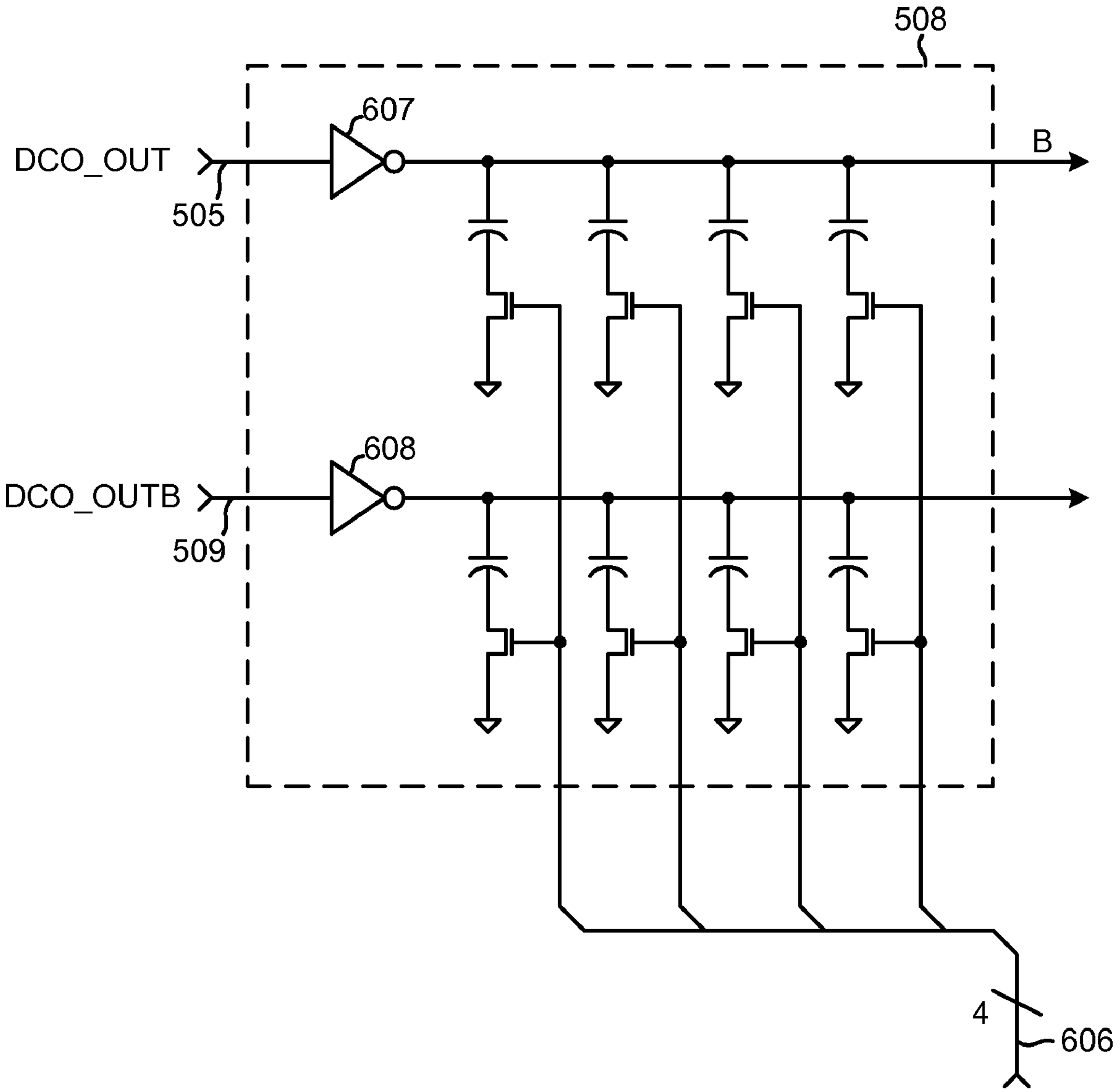
FIG. 19 is a circuit diagram of one way to realize the programmable delay element 508 of the novel high-resolution TDC of FIG. 13.

FIG. 19 is a diagram of one way to realize programmable delay element 508 of FIG. 13. The propagation delay through a common inverter depends at least to some degree on the loading on its output lead. The four-bit control word output by counter 605 of FIG. 16 is supplied onto lines 606 so that the magnitude of the digital value on lines 606 determines the magnitude of capacitive loading on the complementary metal oxide semiconductor (CMOS) inverters 607 and 608.

Figure 20:
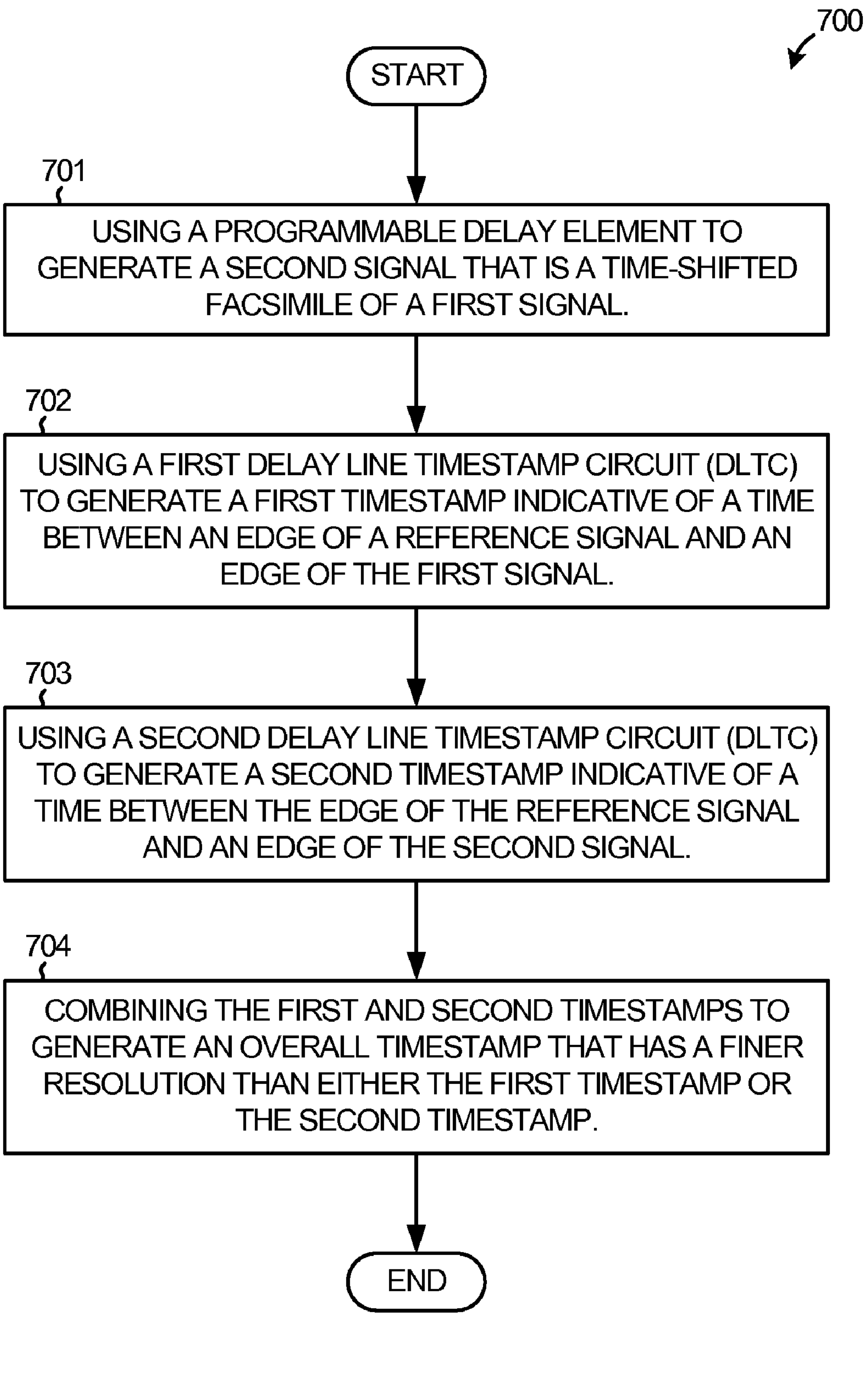
FIG. 20 is a flowchart of a method 700 in accordance with one novel aspect.

FIG. 20 is a flowchart of a novel method 700. A programmable delay element is used (step 701) to generate a second signal that is a time-shifted facsimile of a first signal. In one example, the time-shift between corresponding edges of the first and second signals is one-half of the propagation delay through an inverter. A first delay line timestamp circuit (DLTC) is used (step 702) to generate a first timestamp indicative of a time between an edge of a reference signal and an edge of the first signal. In one example, this first DLTC is DLTC 501 of FIG. 13. A second delay line timestamp circuit (DLTC) is used (step 703) to generate a second timestamp indicative of a time between the edge of the reference signal and an edge of the second signal. In one example, this second DLTC is DLTC 502 of FIG. 13. The first and second timestamps are combined (step 704) to generate an overall timestamp that has a finer resolution than either the first timestamp or the second timestamp. In the example of FIG. 13, the first timestamp is the multi-bit digital value D[0], D[2], D[4] and so forth, whereas the second timestamp is the multi-bit digital value D[1], D[3], D[5] and so forth. The overall finer resolution timestamp is the multi-bit digital value D[0], D[1], D[2], D[3], D[4], D[5] and so forth.

In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

Although certain specific embodiments are described above for instructional purposes, the teachings of this patent document have general applicability and are not limited to the specific embodiments described above. The integrator circuit, comparator, up/down counter, and programmable delay element circuit described above are set forth as just one example of how a fractional-delay element circuit can be implemented. Embodiments are possible in which there are three or more time-shifted signals generated by the fractional-delay element circuit and where there are three or more corresponding DLTCs. Timestamp values can be encoded in various different fashions. The delay elements within the delay lines of the DLTCs need not be an inverter but rather can be another type of circuit element including a passive element, and the time-shift between the first and second signals can be made to be a fraction of the propagation delay through such another type of delay element. Accordingly, various modifications, adaptations, and combinations of the various features of the described specific embodiments can be practiced without departing from the scope of the claims that are set forth below.

What is claimed is:

1. A circuit comprising:

a fractional-delay element circuit that receives an input signal S0 and outputs a first time-shifted version (S1) of the input signal, and that outputs a second time-shifted version (S2) of the input signal, wherein S2 is time-shifted with respect to S1 by a fixed fractional amount of a propagation delay through a delay element;

a first delay line timestamp circuit (DLTC) that receives S1, wherein the first DLTC includes a first delay line through which S1 propagates; and a second DLTC that receives S2, wherein the second DLTC includes a second delay line through which S2 propagates, wherein the delay element is an inverter, wherein the first delay line is a delay line of inverters, and wherein the second delay line is a delay line of inverters.

2. A circuit comprising:

a fractional-delay element circuit that receives an input signal S0 and outputs a first time-shifted version (S1) of the input signal, and that outputs a second time-shifted version (S2) of the input signal, wherein S2 is time-shifted with respect to S1 by a fixed fractional amount of a propagation delay through a delay element;

a first delay line timestamp circuit (DLTC) that receives S1, wherein the first DLTC includes a first delay line through which S1 propagates; and a second DLTC that receives S2, wherein the second DLTC includes a second delay line through which S2 propagates, wherein the fractional-delay element circuit includes:

a first propagation delay circuit that receives the input signal S0 and outputs S1;

a second propagation delay circuit that receives the input signal S0 and outputs S2, wherein the second propagation delay circuit includes a programmable delay element; and a time difference equalization circuit that controls the programmable delay element.

3. The circuit of claim 2, wherein the fractional-delay element circuit detects a first time difference between an edge of a signal on a first node and an edge of a signal on a second node, wherein the fractional-delay element circuit detects a second time difference between the edge of the signal on the second node and an edge of a signal on a third node, and wherein the fractional-delay element circuit causes the first and second time differences to be substantially equal.

4. The circuit of claim 3, wherein the first node is a node of the first propagation delay circuit, wherein the second node is a node of the second propagation delay circuit, and wherein the third node is a node of the first propagation delay circuit.

5. The circuit of claim 2, wherein the programmable delay element includes a logic element having a programmable load, and wherein the programmable delay element receives a multi-bit digital value that determines a magnitude of the programmable load.

6. A method comprising:

(a) supplying a first signal onto a first input node of a first delay line timestamp circuit (DLTC), wherein the first DLTC includes a delay line of delay elements;

(b) supplying a reference signal onto a second input node of the first DLTC;

(c) supplying a second signal onto a first input node of a second DLTC, wherein the second DLTC includes a delay line of delay elements;

(d) supplying the reference signal onto a second input node of the second DLTC; and (e) controlling the first signal with respect to the second signal such that the second signal is a time-shifted facsimile of the first signal, and such that the second signal is time-shifted with respect to the first signal by a fixed fraction of a propagation delay through a delay element.

7. The method of claim 6, wherein the delay elements of the delay line of the first DLTC are inverters, wherein the delay elements of the delay line of the second DLTC are inverters, and wherein the propagation delay though the delay element in (e) is a propagation delay through an inverter.

8. The method of claim 6, wherein (e) involves controlling a load on a second logic element such that a propagation delay through the second logic element is one and one-half times as long as a propagation delay through a first logic element, wherein the first and second logic elements are substantially identical structures.

9. The method of claim 6, wherein (e) involves generating a first time difference signal indicative of a first time difference between a first time when a first signal edge exits a first inverter to a second time when a second signal edge exits a second inverter, wherein (e) involves generating a second time difference signal indicative of a second time difference between the second time and a third time when a third signal edge exits a third inverter, wherein a programmable load is coupled to an output lead of the second inverter, and wherein the controlling of (e) involves controlling the programmable load.

10. The method of claim 9, wherein (e) further involves determining whether the first time difference signal is greater than the second time difference signal.

11. A method comprising:

using a programmable delay element to generate a second signal, wherein the second signal is a time-shifted facsimile of a first signal, wherein the second signal has a time-shift with respect to the first signal;

using a first time-to-digital converter (TDC) to generate a first timestamp indicative of a time between an edge of the first signal and an edge of a reference signal; and using a second TDC to generate a second timestamp indicative of a time between an edge of the second signal and the edge of the reference signal, wherein the time-shift has a magnitude that is less than a propagation delay through an inverter, and wherein the first and second timestamps are generated simultaneously.

12. The method of claim 11, further comprising:

combining the first timestamp and the second timestamp to generate an overall timestamp, wherein the overall timestamp has a resolution that is finer than a resolution of the first timestamp and that is finer than a resolution of the second timestamp.

13. A circuit comprising:

a first delay line timestamp circuit (DLTC) that has a first timestamp resolution;

a second DLTC that has a second timestamp resolution identical to the first timestamp resolution, wherein the first and second DLTCs generate the first and second timestamps simultaneously in response to an edge of a reference clock signal; and means for supplying a first signal to the first DLTC and for supplying a second signal to the second DLTC such that the first and second timestamps together form an overall timestamp, wherein the overall timestamp has a timestamp resolution that is finer than either the first timestamp resolution or the second timestamp resolution.

14. The circuit of claim 13, wherein the circuit receives an input signal used to generate the first and second signals, and wherein the overall timestamp is a digital value indicative of a delay between an edge of the input signal and the edge of the reference clock signal.

15. The circuit of claim 14, wherein the circuit is a part of a receiver of a mobile communication device.

* * * * *